United States Patent
Yeung et al.

(10) Patent No.: US 11,983,112 B2
(45) Date of Patent: May 14, 2024

(54) TECHNIQUES FOR ENHANCED SYSTEM PERFORMANCE AFTER RETENTION LOSS

(71) Applicant: Micron Technology, Inc., Boise, ID (US)

(72) Inventors: Chun Sum Yeung, San Jose, CA (US); Deping He, Boise, ID (US); Min Rui Ma, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 198 days.

(21) Appl. No.: 17/646,253

(22) Filed: Dec. 28, 2021

(65) Prior Publication Data
US 2023/0205690 A1 Jun. 29, 2023

(51) Int. Cl.
| | |
|---|---|
| G06F 12/00 | (2006.01) |
| G06F 12/0804 | (2016.01) |
| G11C 16/10 | (2006.01) |
| G11C 16/26 | (2006.01) |
| G11C 16/30 | (2006.01) |
| G11C 16/04 | (2006.01) |

(52) U.S. Cl.
CPC ......... *G06F 12/0804* (2013.01); *G11C 16/10* (2013.01); *G11C 16/26* (2013.01); *G11C 16/30* (2013.01); *G06F 2212/1032* (2013.01); *G11C 16/0483* (2013.01)

(58) Field of Classification Search
CPC ......... G06F 12/0804; G06F 2212/1032; G06F 5/00; G06F 17/00; G06F 2200/00; G06F 2211/00; G06F 2218/00
See application file for complete search history.

(56) References Cited

U.S. PATENT DOCUMENTS

2023/0205447 A1\* 6/2023 Muchherla ......... G11C 16/3404
711/154

\* cited by examiner

*Primary Examiner* — Yong J Choe
(74) *Attorney, Agent, or Firm* — Holland & Hart LLP

(57) ABSTRACT

Methods, systems, and devices for techniques for enhanced system performance after retention loss are described. A memory system may program a page of memory cells in response to receiving a power down notification. As part of the programming, the memory system may record an indication of a voltage threshold of the page and power down for a duration of time, during which the memory system may experience retention loss. Upon powering on, the memory device may compare the voltage threshold of the page to the indication stored prior to powering down and determine a voltage offset for one or more blocks of the memory system. In some cases, the memory system may use the voltage offset to determine a starting bin, and may initiate a bin scan to determine a final bin for the one or more blocks.

25 Claims, 7 Drawing Sheets

TECHNIQUES FOR ENHANCED SYSTEM PERFORMANCE AFTER RETENTION LOSS

FIELD OF TECHNOLOGY

The following relates generally to one or more systems for memory and more specifically to techniques for enhanced system performance after retention loss.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
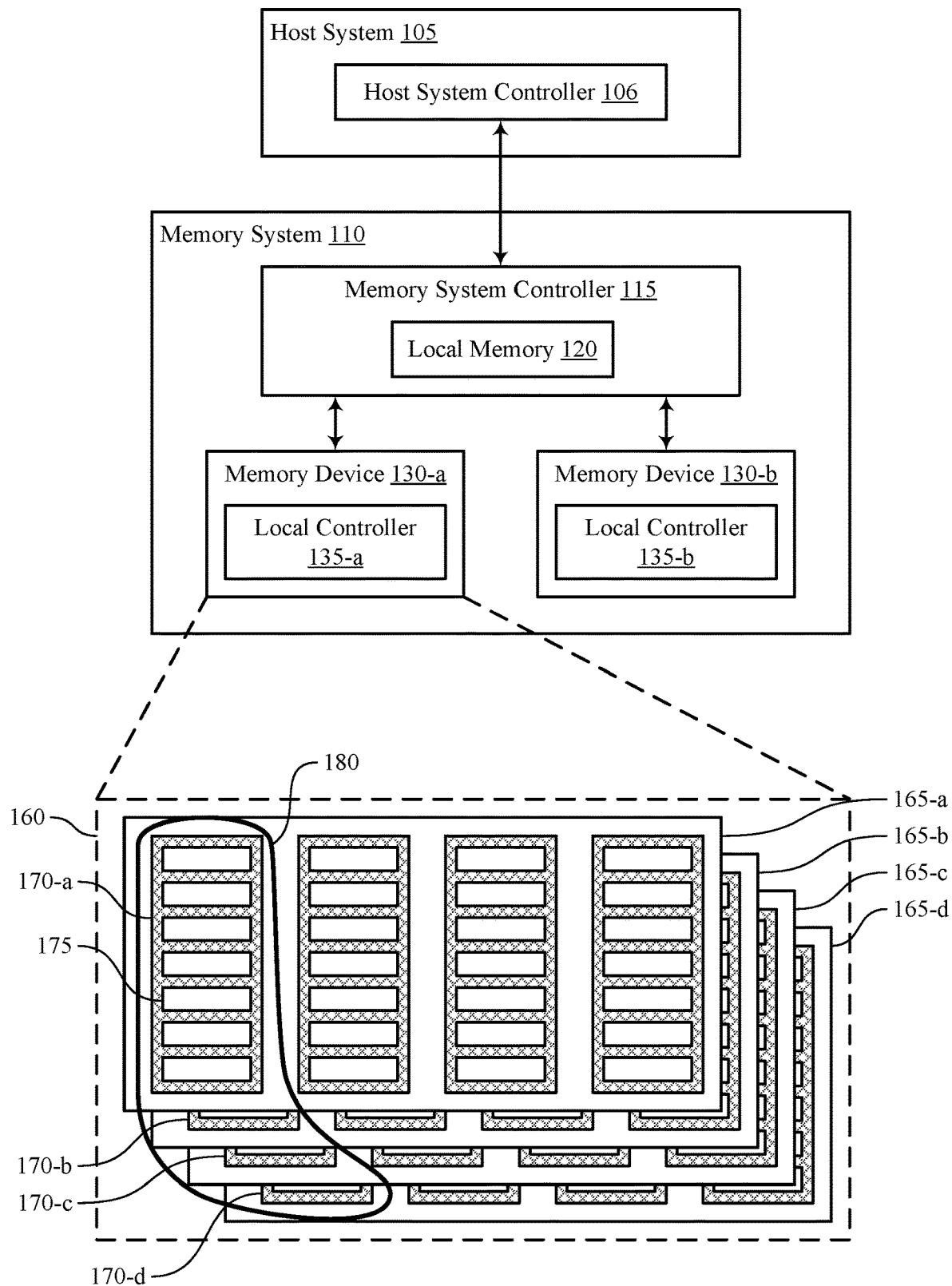
FIG. 1 illustrates an example of a system that supports techniques for enhanced system performance after retention loss in accordance with examples as disclosed herein.

In some memory systems, retention loss may impact read performance of the memory system over time. For example, voltage levels stored in one or more memory cells may change over time due to retention loss (e.g., charge may leak out of the memory cells). Such retention loss may result in reduced system performance, such as inaccurate reading of the memory cell (e.g., the voltage may drop below a read threshold voltage and the memory cell may be read incorrectly as a different logic state), unnecessary triggering of error handling, increased read latency, or any combination thereof. The amount of retention loss of one or more memory cells (e.g., a block of memory cells) may be indicated by a bin. For example, a memory system may have a quantity of bins (e.g., eight bins) into which blocks of memory cells may be sorted. The bins may be numbered, sequenced, or otherwise labeled, so that a block of memory cells in a "small" bin (e.g., bin 0, the first bin of the sequence) have experienced less retention loss than a block of memory cells in a "large" bin (e.g., later bins in the sequence, such as bin 1, bin 2, etc.). In some cases, the memory system may issue a bin scan. As an example, the bin scan may be a procedure to determine an amount of retention loss a block of memory cells has experienced and select a bin number for the block of memory cells, the bin number indicating a magnitude or amount of retention loss experienced by the block. In some cases, the bin scan may be a background scan that is run according to a schedule, such as one bin scan issued per 24 hours, though any schedule or periodicity of the bin scan may be used. Thus, the memory system may identify and record bin numbers for respective portions of the memory system. The bin numbers may indicate the retention loss for a portion of the memory system (e.g., the bin number may indicate how much charge has been lost from a block of memory cells, a voltage offset for adjusting a read threshold for the block of memory cells, which may account for the retention loss, and the like), and using the voltage offset as part of access commands may improve read performance and accuracy. For example, the memory system may shift a read threshold by the indicated voltage offset associated with a bin number during an access operation, which may result in more accurate results for the read operation, reduced errors, and the like. However, issuing such bin scans according to the schedule may still allow for or result in reduced read performance. For example, if a memory system spends a relatively long time in a powered down state, the memory system may undergo significant retention loss, but may not perform a bin scan for a relatively long time (e.g., until a next bin scan indicated by the schedule). Thus, the memory system may experience reduced read performance between being powered on and the bin scan being issued.

In accordance with the techniques described herein, a memory system may implement techniques for retention loss recovery, which may enable the memory system to determine whether a relatively high retention loss has occurred (e.g., due to being powered off for a relatively long time or experiencing high temperatures). For example, the memory system may determine a voltage offset associated with a reference set of memory cells (e.g., a block, a page, etc.) as part of a power on operation. In some examples, the memory system may determine (e.g., select) a bin for one or more blocks of memory cells using the voltage offset. For example, after receiving a power down notification, the memory system may program the reference set of memory cells (e.g., a page), such as memory cells associated with a firmware log or flash translation layer (FTL) table. The memory system may record an indication of a voltage (e.g., a metric of a voltage distribution) for the page, and the memory system may subsequently power down. Upon being powered up, the memory system may determine a second voltage of the page (e.g., after the page has undergone retention loss) and compare the second voltage to the stored indication of the voltage prior to the power cycle. In some examples, the voltage offset may be a difference between the stored voltage (e.g., a voltage prior to power down of the memory system) and the second voltage (e.g., a voltage after power on of the memory system). In some cases, the memory system may use the voltage offset to select a bin for one or more blocks (e.g., the memory system may select a bin to use for read operations without issuing a bin scan). Additionally or alternatively, the memory system may use the voltage offset to determine a starting bin to use for a bin scan (e.g., a dynamically issued bin scan in addition or alternative to a scheduled bin scan). Such techniques may improve system performance by reducing read errors due to retention loss, for example, during a period between power on of the memory system and a next scheduled bin scan, among other advantages.

Figure 2:
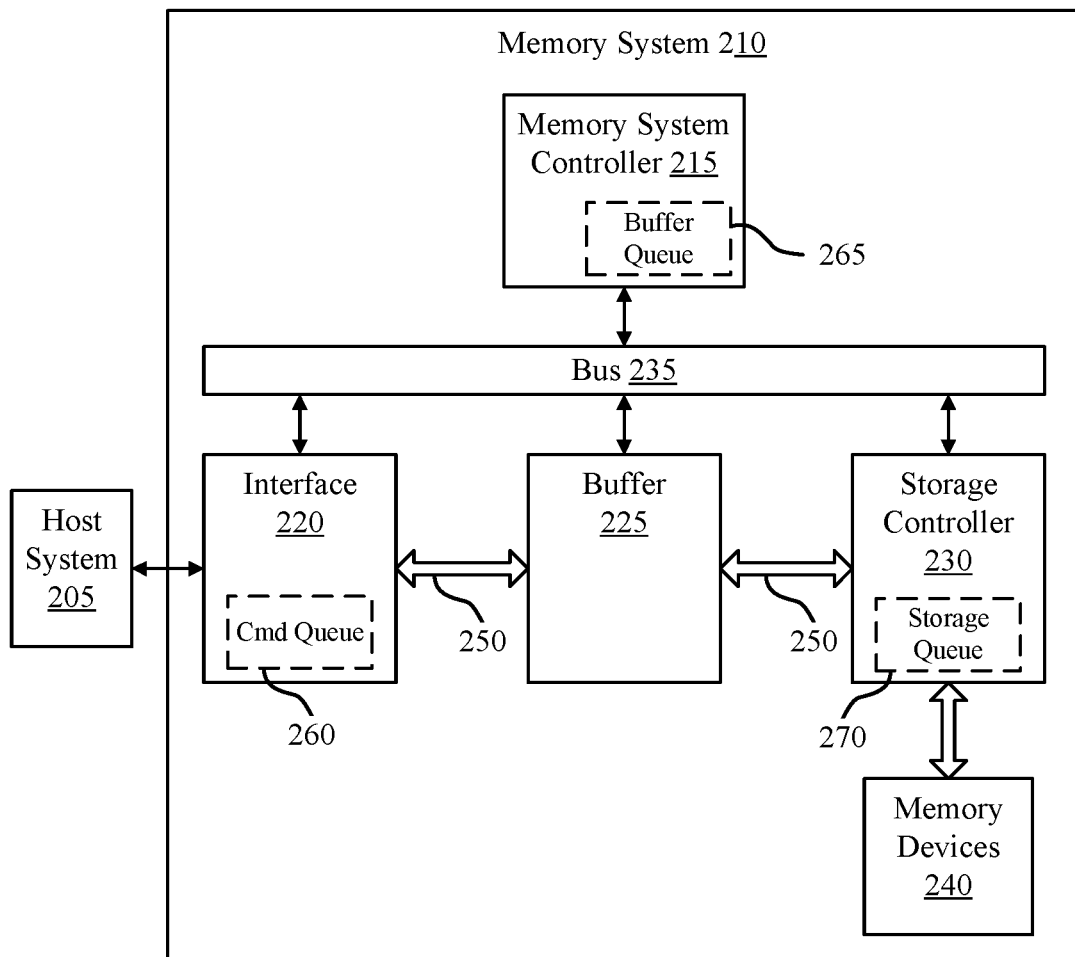
FIG. 2 illustrates an example of a system that supports techniques for enhanced system performance after retention loss in accordance with examples as disclosed herein.

Features of the disclosure are initially described in the context of systems, devices, and circuits with reference to FIGS. 1 through 2. Features of the disclosure are described in the context of plots of read distributions and a process flow with reference to FIGS. 3-5. These and other features of the disclosure are further illustrated by and described in the context of an apparatus diagram and flowchart that relate to techniques for enhanced system performance after retention loss with reference to FIGS. 6-7.

FIG. 1 illustrates an example of a system 100 that supports techniques for enhanced system performance after retention loss in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165 *c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support techniques for enhanced system performance after retention loss. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some cases, the memory system 110 may determine a bin for one or more blocks of memory cells 170 upon being powered on by determining a voltage offset for a reference block 170. For example, after receiving a power down notification, the memory system may program one or more memory cells of a page 175, such as a firmware log or FTL table. As part of programming the page 175, the memory system may record an indication of a voltage metric, such as a median voltage or a low voltage, among other examples, for the one or more memory cells, and the memory system 110 may subsequently power down. Upon being powered up, the memory system may determine a voltage metric of the page 175 (e.g., after the page 175 has undergone retention loss) and compare the voltage metric to the stored indication of the read threshold prior to the power cycle. Using the difference of the two metrics, the memory system 110 may determine a voltage offset. In some cases, the memory system 110 may use the voltage offset to determine a final bin for the block 170 containing the page 175 of memory cells. Additionally or alternatively, the memory system 110 may use the voltage offset to determine a starting bin to use for a bin scan. Determining a bin for the block of memory cells 170 may improve system performance by reducing read errors due to retention loss prior to a bin scan issued as part of a bin scan schedule.

FIG. 2 illustrates an example of a system 200 that supports techniques for enhanced system performance after retention loss in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on (e.g., using) the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, if the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

In some cases, the memory system 210 may determine a bin, for example using the memory system controller 215, for one or more blocks of memory cells of memory devices 240 upon being powered on by determining a voltage offset for a reference block. For example, after receiving a power down notification, the memory system 210 may program one or more memory cells of a page of the memory devices 240, such as a firmware log or FTL table. As part of programming the page, the memory system may record an indication of a voltage metric for the page, and the memory system 210 may subsequently power down. Upon being powered up, the memory system 210 may determine a voltage metric of the page (e.g., after the page has undergone retention loss) and compare the voltage metric to the stored indication of the voltage metric prior to the power cycle. Using the difference of the two voltage metric, the memory system 210 may determine a voltage offset. In some cases, the memory system 210 may use the voltage offset to determine a final bin for the block containing the page of memory cells. Additionally or alternatively, the memory system 210 may use the voltage offset to determine a starting bin to use for a bin scan. Determining a bin for the block of memory cells may improve system performance by reducing read errors due to retention loss prior to a bin scan issued as part of a bin scan schedule.

Figure 3:
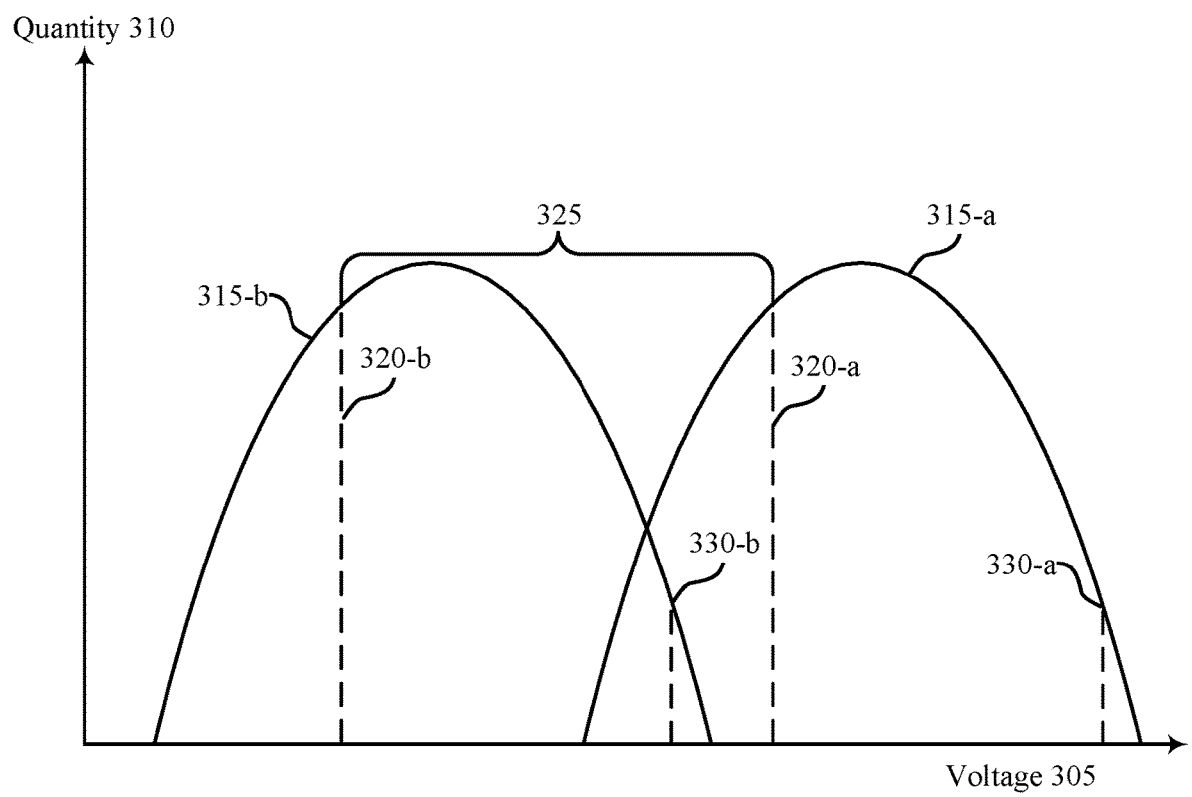
FIG. 3 illustrates an example of a plot of example read distributions that supports techniques for enhanced system performance after retention loss in accordance with examples as disclosed herein.

FIG. 3 illustrates an example of a plot 300 of example read distributions that support techniques for enhanced system performance after retention loss in accordance with examples as disclosed herein. The plot 300 may illustrate examples of operations implemented by a system 100 as described with reference to FIG. 1 or another system as described herein. The plot 300 may include a voltage axis 305 and a quantity axis 310 for illustrative clarity, although any other metrics may be used (e.g., a current axis or a charge axis rather than a voltage axis). Generally, the plot 300 may illustrate example distributions 315 for the voltages of memory cells in a memory array before and after a duration spent in a powered down state.

The plot 300 may include distributions 315-a and 315-b. The distributions 315 may illustrate voltage distributions of one or more memory cells (e.g., a page of memory cells) programmed with a same logic state (e.g., a logic 1, 0, or other logic states) before and after a duration spent in a powered off state. For example, the distribution 315-a may be an example of the distribution of voltages corresponding to a first logic state (e.g., a logic 1 for SLC memory cells) programmed to a memory cell after receiving a power down notification but before powering down a memory system containing the memory cell, while the distribution 315-b may be an example of the distribution of voltages corresponding to the same logic state stored in the memory cell after being in a powered down state for a duration.

The plot 300 may include voltage metric 320-a and voltage metric 320-b, which may be examples of a low threshold, a high threshold, an average value of the distributions 315, or a median value of the distributions 315, among other examples of metrics. That is, a voltage metric 320 may be a metric associated with a respective voltage distribution 315 (e.g., the voltage metric 320-a may correspond to the distribution 315-a and the voltage metric 320-b may correspond to the distribution 315-b). In some cases, a memory system (e.g., a memory device) may use a read threshold for read operations. For example, if a sense component of the memory system detects a voltage lower than the read threshold, the memory system may read the corresponding memory cell as storing a first logic value (e.g., a 0 or a 1). Alternatively, if the sense component detects a voltage higher than the read threshold, the memory system may read the corresponding memory cell as storing a second logic value (e.g., a 1 or a 0).

In some examples, the distribution 315-b may be shifted relative to the distribution 315-a due to retention loss, such as from experiencing a relatively high temperature, being in a power off state for a relatively long time, or both. For example, the distribution 315-b may have shifted downward (e.g., the voltages stored in the memory cell may have decreased) after the duration spent in the powered down state. That is, a portion of the charge stored in the memory cell may have leaked out the cells, thus reducing the stored voltage. In such examples, using a read threshold to read data stored in the memory cell after the duration spent in the powered down state may result in read errors (e.g., due to the shift of the distribution 315-b). Thus, the memory system may determine a voltage offset 325 to apply to read operations performed on the memory cell to improve the accuracy and speed of read commands. For example, the memory system may identify the voltage offset 325 indicating a downshift in voltage from the distribution 315-a to the distribution 315-b (e.g., a difference between the metric 320-a and the metric 320-a may be used to estimate a voltage shift, such as an average voltage shift for the distribution).

In some cases, the memory system may use the voltage offset 325 to determine a bin from a set of one or more bins for the memory cell. In some examples, a bin may indicate a magnitude or amount of retention loss experienced by the block. That is, a block assigned to a "small" bin may have undergone less retention loss and thus be associated with a smaller voltage offset than a block assigned to a "large" bin. For example, if the memory system identifies a relatively large voltage offset 325, the memory system may assign a bin number associated with a large retention loss. Thus, if reading from memory cells associated with the assigned bin number, the memory system may use a read threshold adjusted by an amount associated with the bin number (e.g., the memory system may move the read threshold a value to the left, the value associated with the bin number) which may enable a more accurate read threshold to be used. In other words, the adjusted read threshold may account for voltage downshifts and correct any errors that may occur due to incorrectly reading logic states in the distributions 315 as a different logic state (e.g., some states in the distribution may have voltages that shift below the unadjusted read threshold, and are thus read incorrectly).

In some cases, a memory system may identify the voltage offset 325 of the distributions 315 after a duration spent in a powered down state by, for example, comparing the distribution 315-a of a set of reference memory cells (e.g., a page of SLCs) programmed prior to being powered down to the distribution 315-b of the set of reference memory cells after power on. For example, prior to powering down the memory system may receive a power down notification from a host system (e.g., a graceful power down). In response to receiving the power down notification, the memory system may write a page of memory cells as part of a power down operation, such as writing or updating a firmware log or a FTL table, among other examples. In some examples, the page of memory cells may be examples of an SLC page, but other page types (e.g., multi-level cell (MLC) pages, triple-level cell (TLC) pages, quad-level cell (QLC) pages, etc.) or portions of the memory system are possible.

In some cases, as part of writing the page of memory cells, the memory system may also store an indication of the voltage metric 320-a. In such cases, the memory system may obtain the voltage metric 320-b during power on and compare it to the stored voltage metric 320-a to determine the voltage offset 325. Additionally or alternatively, the voltage metric 320-a may be determined (e.g., estimated) using characterization data after power on. For example, the memory system may use data associated with a characterization of the page (or any other reference portion of the memory cell for identifying the voltage offset 325) to estimate the voltage metric 320-*a* prior to power down, and use the voltage metric 320-*a* to identify the voltage offset 325.

Upon being powered on, the memory system may determine the voltage metric 320-*b* of the page of memory cells, for example by using a binary search and erase page check to determine whether the voltage metric 320-*b* of the page of memory cells is above a threshold. The voltage offset 325 may thus be determined by comparing the voltage metric 320-*a* (e.g., the median voltage of a memory cell programmed before being powered off) to the voltage metric 320-*b* (e.g., the median voltage of the page after undergoing retention loss).

The memory system may use the voltage offset 325 (e.g., a voltage offset corresponding to the reference SLC before and after spending a duration in the powered off state) to determine a read threshold for performing reads on a TLC block. That is, the voltage offset 325 of an SLC page may allow for a quick estimation of the voltage offset 325 of a TLC page, for example using known relationships between retention loss for SLC and TLC blocks or characterization data, among other examples.

In some cases, the voltage offset 325 may be determined using different voltage metrics 330-*a* and 330-*b* (e.g., different than the voltage metrics 320-*a* and 320-*b*). For example, the voltage offset may be determined using the difference between a median voltage of the distribution 315-*a* and a median voltage of the distribution 315-*b*. Additionally or alternatively, the voltage offset may be determined using the difference between a low voltage of the distribution 315-*a* and a low voltage of the distribution 315-*b*. In such cases, the different voltage metrics 330-*a* and 330-*b* (e.g., the low or median voltage thresholds) may be determined using characterization data or recorded as part of writing the firmware log or FTL table. In some examples, some combination of metrics may be used to identify the voltage offset 325.

In some cases, the memory system may determine whether the voltage offset 325 satisfies a threshold. That is, the memory system may determine whether the voltage offset 325 is relatively small (e.g., sufficiently small so as to not significantly cause read errors). If the memory system determines that the voltage offset 325 does not satisfy the threshold (e.g., the voltage offset 325 is greater than a threshold offset, which may indicate that the voltage offset 325 is relatively large), the memory system may initiate a bin scan on each block of the memory system to retarget the read offsets of each block of the memory system. A bin scan may be a procedure performed the memory system (e.g., by firmware) to assign a bin to a block of memory cells. In some cases, prior to performing the bin scan, the memory system may select a bin (e.g., using the voltage offset 325) to use as a starting bin in the bin scan.

Using the bin selected with the determined voltage offset 325 may improve the speed and efficiency of the bin scan, for example by using the bin to jump directly to larger bins approximation. That is, a bin scan may begin searching for a final bin to use for determining read thresholds by using a starting bin (e.g., a small bin, a bin corresponding to small retention loss) and iteratively increasing the bin size until the final bin has been determined. Using the bin selected with the determined voltage offset 325 as the starting bin may decrease the iterations performed in the bin scan, thus reducing system latency and power consumption.

Additionally or alternatively, the memory system may determine a final bin using the voltage offset 325 (e.g., without performing a bin scan). For example, the memory system may use characterization data, perform calculations, or a combination thereof. Determining the final bin may reduce system latency and power consumption, for example by refraining from performing a full bin scan (e.g., until a bin scan is scheduled).

If the memory system determines that the voltage offset 325 satisfies the threshold, the memory system may delay initiating a bin scan. For example, the memory system may issue bin scans as part of a bin scan schedule, in which a bin scan is issued periodically (e.g., every 24 hours). Issuing the bin scan as part of the bin scan schedule may reduce system latency or processing overhead during the power on procedure, because, if the voltage offset 325 is small (e.g., satisfies the threshold), the memory system may accurately read data stored in blocks without updating the read thresholds.

In some cases, the memory system may perform an access operation (e.g., a read operation) on a block of memory cells using the selected bin of the block to adjust the read threshold. For example, if measuring the voltage of a memory cell and comparing it to the read voltage, the memory system may adjust (e.g., shift, increase, decrease) the read threshold by an amount indicated by a respective bin (e.g., a bin selected using the voltage offset 325) associated with the block. Adjusting the read voltage may allow the memory system to more accurately sense the logical state stored in the memory cell by allowing the memory system to compensate for any retention loss associated with the block containing the memory cell.

Figure 4:
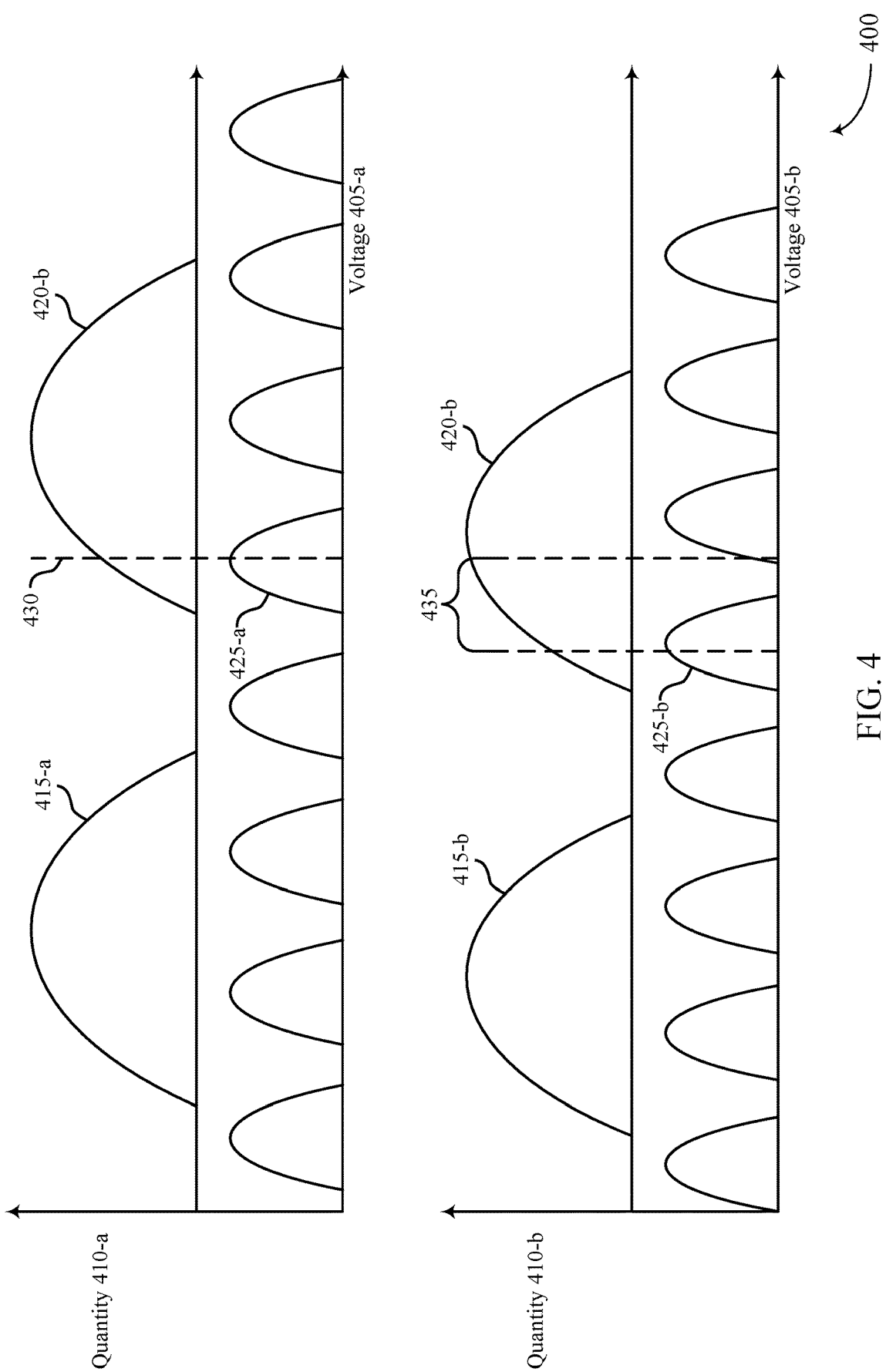
FIG. 4 illustrates an example of plots of example read distributions that support techniques for enhanced system performance after retention loss in accordance with examples as disclosed herein.

FIG. 4 illustrates an example of a plot 400 of example read distributions that support techniques for enhanced system performance after retention loss in accordance with examples as disclosed herein. The plot 400 may illustrate examples of operations implemented by a system 100 as described with reference to FIG. 1 or another system as described herein. The plot 400 may include aspects of the plot 300. For example, the plot 400 may include voltage axes 405-*a* and 405-*b* and a quantity axes 410-*a* and 410-*b* for illustrative clarity, although other metrics may be used (e.g., a current axis or a charge axis rather than a voltage axis), as well as distributions 415, which may be examples of distributions 315 as described with reference to FIG. 3.

Generally, the plot 400 may illustrate example distribution 415-*a* and 420-*a* corresponding to a first logical state (e.g., a logic 0 or 1) and a second logic state (e.g., a logic 1 or 0), respectively, of a set of reference memory cells (e.g., a page of SLC memory cells) prior to spending a duration in a powered down state, while distributions 415-*b* and 420-*b* may correspond to the first and second logical states of the page of SLC memory cells after spending a duration in a powered down state and undergoing retention loss. Additionally, the plot 400 may illustrate distribution 425-*a*, which may correspond to a logical state of a page TLC memory cells (e.g., a logical 0, 1, 2, 3, 4, 5, 6, or 7) prior to spending a duration in a powered down state, while the distribution 425-*b* may correspond to a logical state of the page of TLC memory cells after spending a duration in a powered down state and undergoing retention loss.

In some cases, a voltage metric 430 of a page of SLC memory cells may be related to the voltage metric 430 of a page of TLC memory cells. That is, if an SLC block and a TLC block have undergone similar retention loss, there may be a relationship (e.g., a formula, a computation, an equation, etc.) between the voltage metric 430 of the SLC block and the voltage metric 430 of the TLC block. Therefore, by determining a voltage offset 435 of an SLC block before and after spending a duration in a powered down state, the voltage offset 435 of a TLC block may be estimated.

In some cases, measuring the voltage offset 435 of a page of SLC cells may be more efficient (e.g., be performed more quickly, use fewer computations, consume less power, etc.) than determining the voltage offset 435 of a page of TLC cells. Additionally, measuring the voltage offset 435 of a page of SLC cells may be more accurate than measuring the voltage offset 435 of a page of TLC cells, for example because of the relatively larger voltage gap (e.g., larger read margin, larger write margin) between states in an SLC block. Therefore, the memory system may improve system performance by determining the voltage offset 435 of a page of SLC memory cells and using the voltage offset 435 of a page of SLC memory cells to estimate voltage offset 435 of other blocks of TLC memory cells in the memory system.

For example, as described with reference to FIG. 3, the memory system may, in response to receiving a power down notification, program a page of SLC memory cells, for example as part of updating an FTL table or firmware logs. As part of programming the page, the memory system may program an indication of a voltage metric or other characterization data of the page of SLC cells (e.g., an indication of the voltage metric prior to being powered down). Subsequently, the memory system may power down, remaining in a powered down state for a duration.

During the powered down state, the memory cells of the memory system may experience retention loss (e.g., the distributions 415-*a* and 420-*a* of a page of SLC memory cells and may shift down to the distributions 415-*b* and 420-*b*, and the distribution 425-*a* of a page of TLC memory cells may shift down to the distribution 425-*b*). If the memory system is then powered on, the memory system may determine the voltage offset 435, for example of the distributions 420-*a* and 420-*b*.

The voltage offset 435 may be determined, for example, by using the indication of the voltage metric or other characterization data of the page of SLC cells recorded prior to powering down. For example, the memory system may measure an indication of the voltage metric of the page of SLC memory cells after the retention loss has occurred to compare to the indication recorded prior to powering down, or otherwise use characterization data of the page of SLC memory cells before and after spending a duration in the powered down state to determine the voltage offset 435 of the page of SLC memory cells. In some cases, the voltage offset 435 of the page of SLC memory cells may be used to estimate the voltage offset 435 of the page of TLC memory cells.

The memory system may use the voltage offset to select a bin for performing access operations on blocks of the memory system. In some example, the memory system may use the bin as a starting bin for a bin scan. The memory system may initiate the bin scan to determine a final read level for blocks (e.g., SLC, MLC, TLC, QLC blocks) of the memory system. As discussed with reference to FIG. 3, using a starting bin determined using the voltage offset 435 may improve system performance. Additionally or alternatively, the memory system may refrain from performing a bin scan and instead use the selected bin to determine a final bin for performing access operations on blocks of the memory system using characterization data or performing calculations.

In some cases, the voltage offset 435 may be small (e.g., smaller than a threshold). In such cases, the memory system use the selected bin to performing access operations on blocks of the memory system without determining a final bin, as described with reference to FIG. 3. In such cases, the memory system may issue bin scans as part of schedule (e.g., a bin scan issued every hour, 24 hours, etc.). Issuing bin scans as part of schedule may improve system performance by, for example, freeing up system resources that would otherwise be used performing a bin scan during power up.

Figure 5:
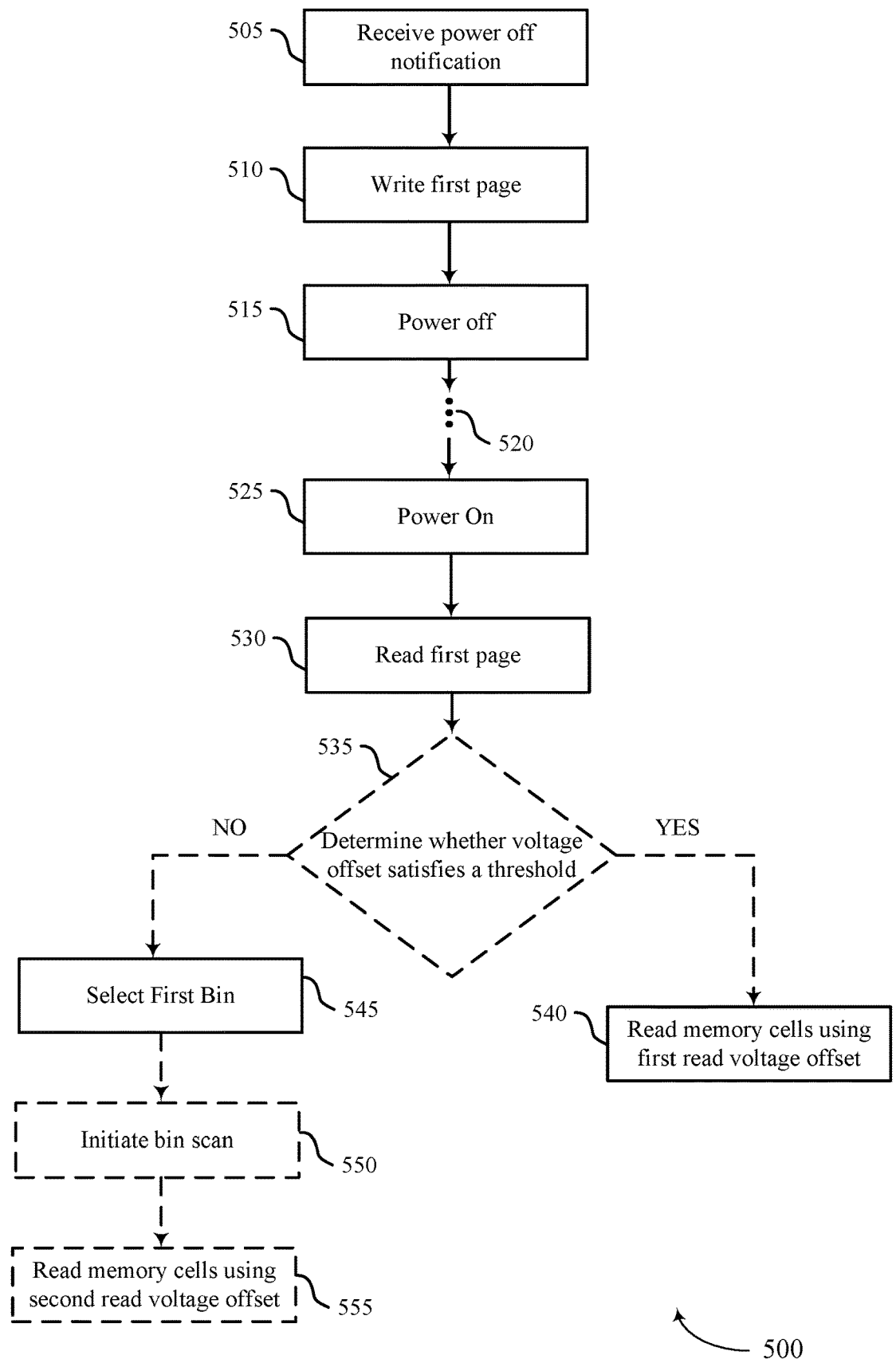
FIG. 5 illustrates an example of a process flow that supports techniques for enhanced system performance after retention loss in accordance with examples as disclosed herein.

FIG. 5 illustrates an example of a process flow 500 that supports techniques for enhanced system performance after retention loss in accordance with examples as disclosed herein. The process flow 500 may be performed by components of a memory system, such as a memory system 110 described with reference to FIGS. 1 and 2. For example, the process flow 500 may be performed by a controller of a memory system or a memory device (or both) such as a memory system controller 115 or a local controller 135, respectively, as described with reference to FIG. 1. The process flow 500 may be implemented to reduce latency and power consumption and increase system performance, among other benefits. Aspects of the process flow 500 may be implemented by a controller, among other components. Additionally or alternatively, aspects of the process flow 500 may be implemented as instructions stored in memory (e.g., firmware stored in a memory coupled with the memory system controller 115 or the local controller 135). For example, the instructions, if executed by a controller (e.g., a memory system controller 115, a local controller 135), may cause the controller to perform the operations of the process flow 500. In the following description of process flow 500, the operations may be performed in a different order than the order shown. For example, specific operations may also be left out of process flow 500, or other operations may be added to process flow 500.

At 505, a power off notification may be received. For example, a host system may transmit a power off notification to the memory system. In response to receiving the power off notification, at 510, a first page may be written. For example, the memory system may write a page of memory cells to one or more blocks, such as firmware log blocks or a FTL table. In some cases, the one or more blocks may be examples of SLC blocks.

In some cases, as part of writing the page of memory cells, a first voltage may be measured. For example, the memory system may identify (e.g., measure) a first voltage associated with the page of memory cells in response to the power off notification received at 505. The first voltage may be an example of a low voltage or a median voltage. In some examples, the first voltage may be referred to as a voltage metric as described herein. An indication of the first voltage may be written, for example by the memory system, to the one or more blocks.

At 515, the memory system may be powered off (e.g., enter a powered down state), for example in response to receiving the power off notification at 505. In some cases, the memory system may remain in the powered down state for a duration 520. In some cases, during the duration 520, the one or more blocks may experience retention loss. In some cases, the retention loss may be accelerated or exacerbated if, for example, the memory system undergoes a high temperature bake.

At 525, the memory system may be powered on (e.g., exit the powered down state). In some cases, as part of performing a power on procedure, at 530, the first page may be read. For example, the memory system may read the first page (e.g., the firmware log or FTL table programmed at 510). As part of reading the first page, the memory system may identify a second voltage associated with the first page. For example, second voltage may indicate a low voltage or a median voltage.

In some cases, the memory system may further read the one or more memory blocks storing the indication of the first voltage (e.g., the first voltage may be identified after the duration spend in the powered down state). Additionally or alternatively, the memory system may estimate the first voltage using characterization data associated with the first page. In some cases, the memory system may identify a voltage shift using the difference between the first voltage and the second voltage.

At 535, it may be determined (e.g., identified) whether the voltage shift satisfies a threshold. For example, the memory system may determine whether the voltage shift identified at 525 is sufficiently small (e.g., smaller than a threshold) so as to not significantly cause read errors using a default read voltage.

At 540, in response to determining that the voltage offset satisfies the threshold (e.g., the voltage offset is smaller than the threshold), one or more memory cells may be read. For example, the memory system may read the one or more memory cells using the first read voltage offset. That is, the memory system may not perform a bin scan or select a final bin for performing access operations (e.g., access operations on one or more memory blocks different than the memory block containing the first page, such as a TLC block), but instead use the first read voltage offset determined as part of reading the first page at 530.

Additionally or alternatively, at 545, in response to determining that the voltage offset does not satisfy the threshold (e.g., the voltage is larger than the threshold), a first bin may be selected. For example, the memory system may select a first bin associated with a first read voltage offset for one or more memory cells of the memory system using a voltage shift of the one or more memory cells. In some cases, At 550, a bin scan may be initiated. For example, the memory system may initiate the bin scan using the first bin selected at 545 as a starting bin. In some cases, the bin scan may determine a final (e.g., second) bin for one or more blocks of memory cells of the memory system. The final bin may indicate a second read voltage offset for performing access operations for one or more blocks of the memory system. Accordingly, at 555, one or more memory cells may be read using the second read voltage offset, for example by the memory system as part of an access operation.

Aspects of the process flow 500 may be implemented by a controller, among other components. Additionally or alternatively, aspects of the process flow 500 may be implemented as instructions stored in memory (e.g., firmware stored in a memory coupled with the memory system). For example, the instructions, if executed by a controller, may cause the controller to perform the operations of the process flow 500.

Figure 6:
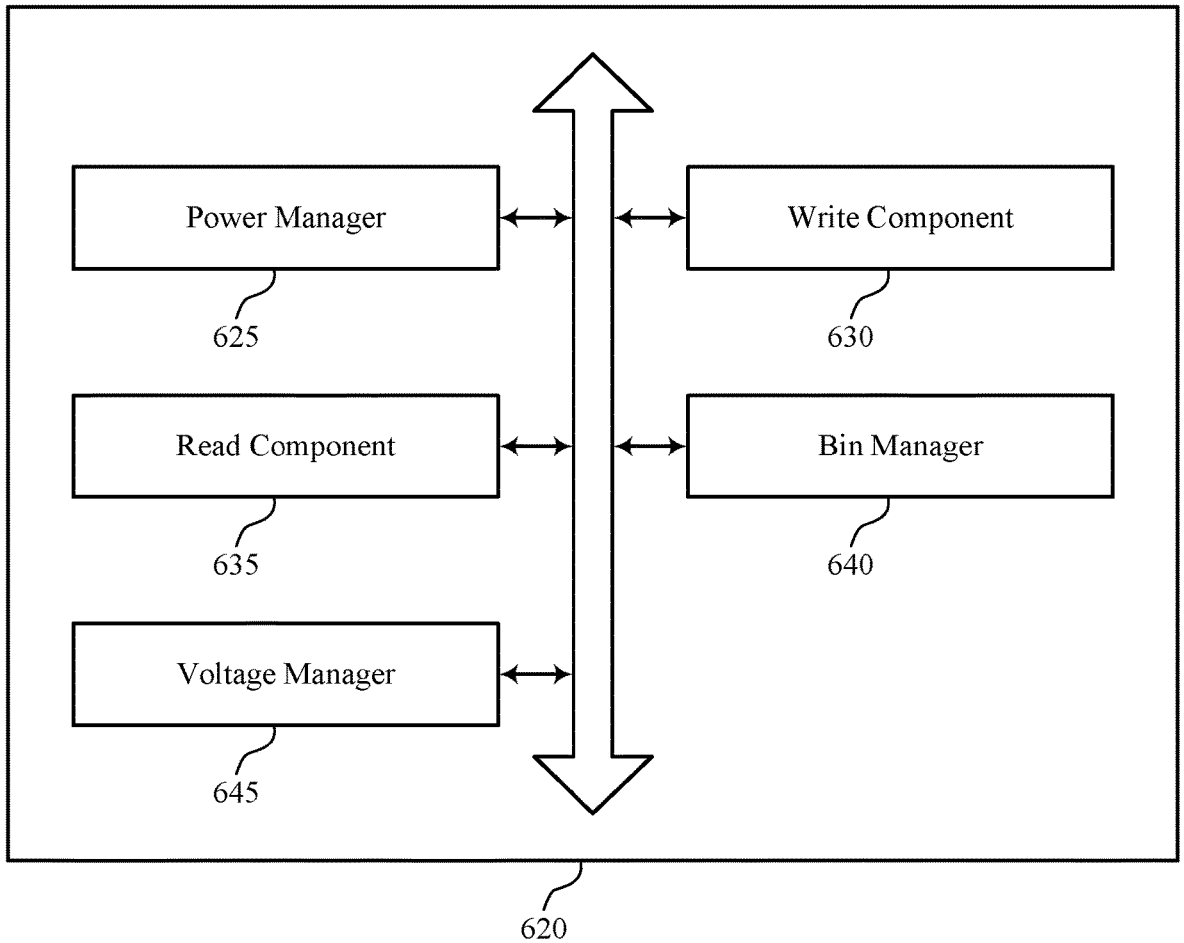
FIG. 6 shows a block diagram of a memory device that supports techniques for enhanced system performance after retention loss in accordance with examples as disclosed herein.

FIG. 6 shows a block diagram 600 of a memory system 620 that supports techniques for enhanced system performance after retention loss in accordance with examples as disclosed herein. The memory system 620 may be an example of aspects of a memory system as described with reference to FIGS. 1 through 5. The memory system 620, or various components thereof, may be an example of means for performing various aspects of techniques for enhanced system performance after retention loss as described herein. For example, the memory system 620 may include a power manager 625, a write component 630, a read component 635, a bin manager 640, a voltage manager 645, or any combination thereof. Each of these components may communicate, directly or indirectly, with one another (e.g., via one or more buses).

The power manager 625 may be configured as or otherwise support a means for receiving a power off notification from a host system. The write component 630 may be configured as or otherwise support a means for writing a first page of the memory system based at least in part on receiving the power off notification. In some examples, the power manager 625 may be configured as or otherwise support a means for powering off the memory system based at least in part on writing the first page of the memory system. The read component 635 may be configured as or otherwise support a means for reading the first page of the memory system as part of a power on operation. The bin manager 640 may be configured as or otherwise support a means for selecting a first bin associated with a first read voltage offset for one or more memory cells of the memory system using a voltage shift of the one or more memory cells based at least in part on reading the first page.

In some examples, to support powering off the memory system, the power manager 625 may be configured as or otherwise support a means for powering off the memory system for a duration, where selecting the first bin is based at least in part on powering off the memory system for the duration.

In some examples, the bin manager 640 may be configured as or otherwise support a means for initiating a bin scan for the one or more memory cells using the selected first bin. In some examples, the bin manager 640 may be configured as or otherwise support a means for identifying a second bin associated with a second read voltage offset for the one or more memory cells based at least in part on initiating the bin scan. In some examples, the read component 635 may be configured as or otherwise support a means for reading the one or more memory cells using a read voltage threshold corresponding to the second read voltage offset based at least in part on identifying the second bin.

In some examples, the read component 635 may be configured as or otherwise support a means for reading the one or more memory cells using a read voltage threshold corresponding to the first read voltage offset based at least in part on selecting the first bin.

In some examples, the voltage manager 645 may be configured as or otherwise support a means for identifying a first voltage associated with the first page during a first duration associated with writing the first page. In some examples, the voltage manager 645 may be configured as or otherwise support a means for identifying a second voltage associated with the first page during a second duration associated with reading the first page. In some examples, the voltage manager 645 may be configured as or otherwise support a means for identifying the voltage shift based at least in part on reading the first page, where the voltage shift includes a difference between the first voltage and the second voltage.

In some examples, to support identifying the first voltage, the voltage manager 645 may be configured as or otherwise support a means for measuring the first voltage in response to the power off notification and writing the first page. In some examples, to support identifying the first voltage, the write component 630 may be configured as or otherwise support a means for writing an indication of the first voltage in one or more memory blocks prior to powering off the memory system. In some examples, to support identifying the first voltage, the read component 635 may be configured as or otherwise support a means for reading the one or more memory blocks based at least in part on the power on operation.

In some examples, the one or more memory blocks include one or more log blocks or a flash transition layer table.

In some examples, to support identifying the first voltage, the voltage manager 645 may be configured as or otherwise support a means for estimating the first voltage as part of the power on operation based at least in part on characterization data associated with the first page.

In some examples, to support identifying the second voltage, the voltage manager 645 may be configured as or otherwise support a means for determining whether a voltage distribution of the first page satisfies a threshold. In some examples, to support identifying the second voltage, the voltage manager 645 may be configured as or otherwise support a means for identifying a low voltage of the voltage distribution or a median voltage of the voltage distribution based at least in part on determining whether the voltage distribution satisfies the threshold, where the second voltage includes the low voltage of the median voltage.

In some examples, the voltage manager 645 may be configured as or otherwise support a means for determining whether the voltage shift satisfies a threshold, where selecting the first bin is based at least in part on the voltage shift satisfying the threshold.

Figure 7:
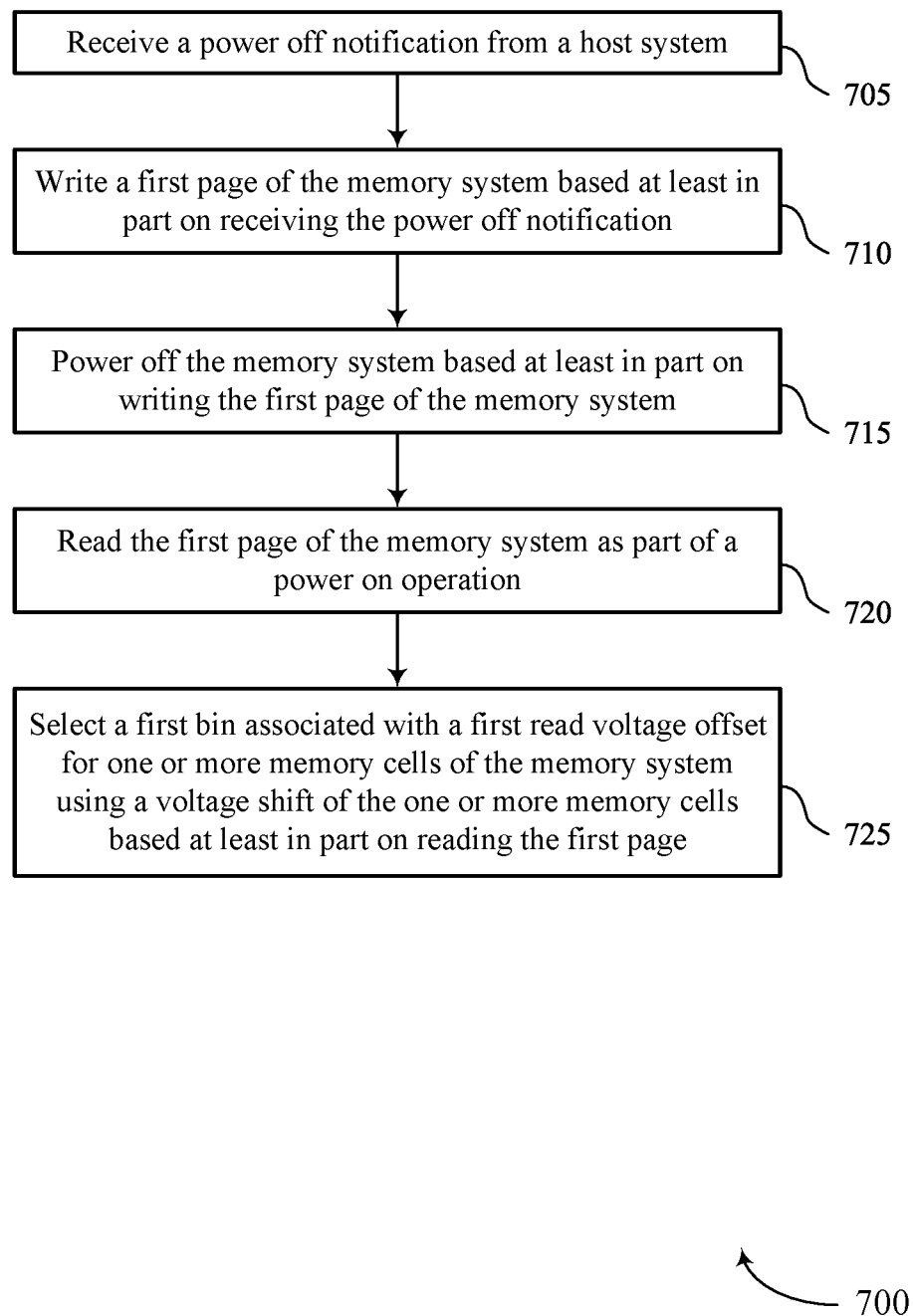
FIG. 7 shows a flowchart illustrating a method or methods that support techniques for enhanced system performance after retention loss in accordance with examples as disclosed herein.

FIG. 7 shows a flowchart illustrating a method 700 that supports techniques for enhanced system performance after retention loss in accordance with examples as disclosed herein. The operations of method 700 may be implemented by a memory system or its components as described herein. For example, the operations of method 700 may be performed by a memory system as described with reference to FIGS. 1 through 6. In some examples, a memory system may execute a set of instructions to control the functional elements of the device to perform the described functions. Additionally or alternatively, the memory system may perform aspects of the described functions using special-purpose hardware.

At 705, the method may include receiving a power off notification from a host system. The operations of 705 may be performed in accordance with examples as disclosed herein. In some examples, aspects of the operations of 705 may be performed by a power manager 625 as described with reference to FIG. 6.

At 710, the method may include writing a first page of the memory system based at least in part on receiving the power off notification. The operations of 710 may be performed in accordance with examples as disclosed herein. In some examples, aspects of the operations of 710 may be performed by a write component 630 as described with reference to FIG. 6.

At 715, the method may include powering off the memory system based at least in part on writing the first page of the memory system. The operations of 715 may be performed in accordance with examples as disclosed herein. In some examples, aspects of the operations of 715 may be performed by a power manager 625 as described with reference to FIG. 6.

At 720, the method may include reading the first page of the memory system as part of a power on operation. The operations of 720 may be performed in accordance with examples as disclosed herein. In some examples, aspects of the operations of 720 may be performed by a read component 635 as described with reference to FIG. 6.

At 725, the method may include selecting a first bin associated with a first read voltage offset for one or more memory cells of the memory system using a voltage shift of the one or more memory cells based at least in part on reading the first page. The operations of 725 may be performed in accordance with examples as disclosed herein. In some examples, aspects of the operations of 725 may be performed by a bin manager 640 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor) for receiving a power off notification from a host system, writing a first page of the memory system based at least in part on receiving the power off notification, powering off the memory system based at least in part on writing the first page of the memory system, reading the first page of the memory system as part of a power on operation, and selecting a first bin associated with a first read voltage offset for one or more memory cells of the memory system using a voltage shift of the one or more memory cells based at least in part on reading the first page.

In some examples of the method 700 and the apparatus described herein, powering off the memory system may include operations, features, circuitry, logic, means, or instructions for powering off the memory system for a duration, where selecting the first bin may be based at least in part on powering off the memory system for the duration.

Some examples of the method 700 and the apparatus described herein may further include operations, features, circuitry, logic, means, or instructions for initiating a bin scan for the one or more memory cells using the selected first bin, identifying a second bin associated with a second read voltage offset for the one or more memory cells based at least in part on initiating the bin scan, and reading the one or more memory cells using a read voltage threshold corresponding to the second read voltage offset based at least in part on identifying the second bin.

Some examples of the method 700 and the apparatus described herein may further include operations, features, circuitry, logic, means, or instructions for reading the one or more memory cells using a read voltage threshold corresponding to the first read voltage offset based at least in part on selecting the first bin.

Some examples of the method 700 and the apparatus described herein may further include operations, features, circuitry, logic, means, or instructions for identifying a first voltage associated with the first page during a first duration associated with writing the first page, identifying a second voltage associated with the first page during a second duration associated with reading the first page, and identifying the voltage shift based at least in part on reading the first page, where the voltage shift includes a difference between the first voltage and the second voltage.

In some examples of the method 700 and the apparatus described herein, identifying the first voltage may include operations, features, circuitry, logic, means, or instructions for measuring the first voltage in response to the power off notification and writing the first page, writing an indication of the first voltage in one or more memory blocks prior to powering off the memory system, and reading the one or more memory blocks based at least in part on the power on operation.

In some examples of the method 700 and the apparatus described herein, the one or more memory blocks include one or more log blocks or a flash transition layer table.

In some examples of the method 700 and the apparatus described herein, identifying the first voltage may include operations, features, circuitry, logic, means, or instructions for estimating the first voltage as part of the power on operation based at least in part on characterization data associated with the first page.

In some examples of the method 700 and the apparatus described herein, identifying the second voltage may include operations, features, circuitry, logic, means, or instructions for determining whether a voltage distribution of the first page satisfies a threshold; and identifying a low voltage of the voltage distribution or a median voltage of the voltage distribution based at least in part on determining whether the voltage distribution satisfies the threshold, where the second voltage includes the low voltage of the median voltage.

Some examples of the method 700 and the apparatus described herein may further include operations, features, circuitry, logic, means, or instructions for determining whether the voltage shift satisfies a threshold, where selecting the first bin may be based at least in part on the voltage shift satisfying the threshold.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if" "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a memory system; and
   a controller coupled with the memory system and configured to cause the apparatus to:
   receive a power off notification from a host system;
   write a first page of the memory system based at least in part on receiving the power off notification;
   power off the memory system based at least in part on writing the first page of the memory system;
   read the first page of the memory system as part of a power on operation; and
   select a first bin associated with a first read voltage offset for one or more memory cells of the memory system using a voltage shift of the one or more memory cells based at least in part on reading the first page of the memory system.

2. The apparatus of claim 1, wherein the controller is further configured to cause the apparatus to:

power off the memory system for a duration, wherein selecting the first bin is based at least in part on powering off the memory system for the duration.

3. The apparatus of claim 1, wherein the controller is further configured to cause the apparatus to:
initiate a bin scan for the one or more memory cells using the selected first bin;
identify a second bin associated with a second read voltage offset for the one or more memory cells based at least in part on initiating the bin scan; and
read the one or more memory cells using a read voltage threshold corresponding to the second read voltage offset based at least in part on identifying the second bin.

4. The apparatus of claim 1, wherein the controller is further configured to cause the apparatus to:
read the one or more memory cells using a read voltage threshold corresponding to the first read voltage offset based at least in part on selecting the first bin.

5. The apparatus of claim 1, wherein the controller is further configured to cause the apparatus to:
identify a first voltage associated with the first page of the memory system during a first duration associated with writing the first page of the memory system;
identify a second voltage associated with the first page of the memory system during a second duration associated with reading the first page of the memory system; and
identify the voltage shift based at least in part on reading the first page of the memory system, wherein the voltage shift comprises a difference between the first voltage and the second voltage.

6. The apparatus of claim 5, wherein the controller is further configured to cause the apparatus to:
measure the first voltage in response to the power off notification and writing the first page of the memory system;
write an indication of the first voltage in one or more memory blocks prior to powering off the memory system; and
read the one or more memory blocks based at least in part on the power on operation.

7. The apparatus of claim 6, wherein the one or more memory blocks comprise one or more log blocks or a flash transition layer table.

8. The apparatus of claim 5, wherein the controller is further configured to cause the apparatus to:
estimate the first voltage as part of the power on operation based at least in part on characterization data associated with the first page of the memory system.

9. The apparatus of claim 5, wherein the controller is further configured to cause the apparatus to:
determine whether a voltage distribution of the first page of the memory system satisfies a threshold; and
identify a low voltage of the voltage distribution or a median voltage of the voltage distribution based at least in part on determining whether the voltage distribution satisfies the threshold, wherein the second voltage comprises the low voltage of the median voltage.

10. The apparatus of claim 1, wherein the controller is further configured to cause the apparatus to:
determine whether the voltage shift satisfies a threshold, wherein selecting the first bin is based at least in part on the voltage shift satisfying the threshold.

11. A non-transitory computer-readable medium storing code comprising instructions which, when executed by a processor of an electronic device, cause the electronic device to:
receive a power off notification from a host system;
write a first page of a memory system based at least in part on receiving the power off notification;
power off the memory system based at least in part on writing the first page of the memory system;
read the first page of the memory system as part of a power on operation; and
select a first bin associated with a first read voltage offset for one or more memory cells of the memory system using a voltage shift of the one or more memory cells based at least in part on reading the first page of the memory system.

12. The non-transitory computer-readable medium of claim 11, wherein the instructions, when executed by the processor of the electronic device, further cause the electronic device to:
power off the memory system for a duration, wherein selecting the first bin is based at least in part on powering off the memory system for the duration.

13. The non-transitory computer-readable medium of claim 11, wherein the instructions, when executed by the processor of the electronic device, further cause the electronic device to:
initiate a bin scan for the one or more memory cells using the selected first bin;
identify a second bin associated with a second read voltage offset for the one or more memory cells based at least in part on initiating the bin scan; and
read the one or more memory cells using a read voltage threshold corresponding to the second read voltage offset based at least in part on identifying the second bin.

14. The non-transitory computer-readable medium of claim 11, wherein the instructions, when executed by the processor of the electronic device, further cause the electronic device to:
read the one or more memory cells using a read voltage threshold corresponding to the first read voltage offset based at least in part on selecting the first bin.

15. The non-transitory computer-readable medium of claim 11, wherein the instructions, when executed by the processor of the electronic device, further cause the electronic device to:
identify a first voltage associated with the first page of the memory system during a first duration associated with writing the first page of the memory system;
identify a second voltage associated with the first page of the memory system during a second duration associated with reading the first page of the memory system; and
identify the voltage shift based at least in part on reading the first page of the memory system, wherein the voltage shift comprises a difference between the first voltage and the second voltage.

16. The non-transitory computer-readable medium of claim 15, wherein the instructions, when executed by the processor of the electronic device, further cause the electronic device to:
measure the first voltage in response to the power off notification and writing the first page of the memory system;
write an indication of the first voltage in one or more memory blocks prior to powering off the memory system; and
read the one or more memory blocks based at least in part on the power on operation.

17. The non-transitory computer-readable medium of claim 16, wherein the one or more memory blocks comprise one or more log blocks or a flash transition layer table.

18. The non-transitory computer-readable medium of claim 15, wherein the instructions, when executed by the processor of the electronic device, further cause the electronic device to:
estimate the first voltage as part of the power on operation based at least in part on characterization data associated with the first page of the memory system.

19. The non-transitory computer-readable medium of claim 15, wherein the instructions, when executed by the processor of the electronic device, further cause the electronic device to:
determine whether a voltage distribution of the first page of the memory system satisfies a threshold; and
identify a low voltage of the voltage distribution or a median voltage of the voltage distribution based at least in part on determining whether the voltage distribution satisfies the threshold, wherein the second voltage comprises the low voltage of the median voltage.

20. The non-transitory computer-readable medium of claim 11, wherein the instructions, when executed by the processor of the electronic device, further cause the electronic device to:
determine whether the voltage shift satisfies a threshold, wherein selecting the first bin is based at least in part on the voltage shift satisfying the threshold.

21. A method performed by a memory system, comprising:
receiving a power off notification from a host system;
writing a first page of the memory system based at least in part on receiving the power off notification;
powering off the memory system based at least in part on writing the first page of the memory system;
reading the first page of the memory system as part of a power on operation; and
selecting a first bin associated with a first read voltage offset for one or more memory cells of the memory system using a voltage shift of the one or more memory cells based at least in part on reading the first page of the memory system.

22. The method of claim 21, wherein powering off the memory system comprises:
powering off the memory system for a duration, wherein selecting the first bin is based at least in part on powering off the memory system for the duration.

23. The method of claim 21, further comprising:
initiating a bin scan for the one or more memory cells using the selected first bin;
identifying a second bin associated with a second read voltage offset for the one or more memory cells based at least in part on initiating the bin scan; and
reading the one or more memory cells using a read voltage threshold corresponding to the second read voltage offset based at least in part on identifying the second bin.

24. The method of claim 21, further comprising:
reading the one or more memory cells using a read voltage threshold corresponding to the first read voltage offset based at least in part on selecting the first bin.

25. The method of claim 21, further comprising:
identifying a first voltage associated with the first page of the memory system during a first duration associated with writing the first page of the memory system;
identifying a second voltage associated with the first page of the memory system during a second duration associated with reading the first page of the memory system; and
identifying the voltage shift based at least in part on reading the first page of the memory system, wherein the voltage shift comprises a difference between the first voltage and the second voltage.

* * * * *